United States Patent [19]

Hara

[11] Patent Number: 4,622,571
[45] Date of Patent: Nov. 11, 1986

[54] CMOS INTEGRATED CIRCUIT DEVICE

[75] Inventor: Toshio Hara, Tokyo, Japan

[73] Assignee: Nippon Electric Co., Ltd., Tokyo, Japan

[21] Appl. No.: 822,919

[22] Filed: Jan. 24, 1986

Related U.S. Application Data

[63] Continuation of Ser. No. 466,906, Feb. 16, 1983, abandoned.

[30] Foreign Application Priority Data

Feb. 18, 1982 [JP] Japan .................................. 57-25404

[51] Int. Cl.$^4$ ........................................... H01L 27/02
[52] U.S. Cl. ...................................... 357/42; 357/23.7
[58] Field of Search .............................. 357/42, 23.7

[56] References Cited

U.S. PATENT DOCUMENTS

| | | | |
|---|---|---|---|
| 4,041,518 | 8/1977 | Shimizu | 357/42 |
| 4,314,858 | 2/1982 | Tomasetta et al. | 357/42 |
| 4,353,085 | 10/1982 | Sakurai | 357/42 |
| 4,402,002 | 8/1983 | Sanders et al. | 357/42 |

Primary Examiner—Edward J. Wojciechowicz
Attorney, Agent, or Firm—Charles E. Pfund

[57] ABSTRACT

There is provided a CMOSIC device including: first and second regions of a semiconductor substrate of a first conductivity type, the first and second regions being surrounded and isolated by a field insulating film formed in and on a major surface of the semiconductor substrate; a first MOS transistor which is formed in the first region and which has a source and a drain of a second conductivity type; a third region which is formed in the second region and which has a low resistance; and epitaxial layer of the second conductivity which is grown on the third region and which has a high resistance; and a second MOS transistor which is formed in the epitaxial layer and which has source and drain of the first conductivity type. The width of the field insulating film can be reduced to about half of that of the conventional field insulating film, thus improving the packing density of the semiconductor device.

6 Claims, 3 Drawing Figures

CMOS INTEGRATED CIRCUIT DEVICE

This is a file wrapper continuation of co-pending application Ser. No. 466,906 filed on Feb. 16, 1983, now abandoned.

BACKGROUND OF THE INVENTION

1. Field of the Invention

The present invention relates to a CMOS (complementary metal oxide semiconductor) integrated circuit device.

2. Description of the Prior Art

Recently, CMOSICs have been in increasing demand because of their low power consumption. However, problems arise along with an increase in the packing density of the CMOSIC. In a conventional CMOSIC manufacturing method, a distance between a p-type semiconductor layer as a source or drain of a p-channel transistor and an n-type semiconductor layer as a source or drain of an n-channel transistor tends to be increased in order to prevent a latch-up phenomenon. In other words, a field insulating film or isolation region is formed to have a sufficient width to prevent any latch-up phenomenon.

This problem will be described with reference to FIG. 1. FIG. 1 is a sectional view showing an example of a conventional CMOSIC.

A p-type well region 2 is formed in a major surface of an n-type semiconductor substrate 1. N-type semiconductor layers 4 which have a high impurity concentration (to be referred to as n$^+$-type semiconductor layers 4 hereinafter) are formed in a surface of the p-type well region 2. The n$^+$-type semiconductor layers 4 respectively correspond to source and drain regions of an n-channel transistor. A gate electrode 5 is deposited on the p-type well region 2 through a gate insulating film 9. P-type semiconductor layers 3 which have a high impurity concentration (to be referred to as p$^+$-type semiconductor layers 3 hereinafter) are formed in a surface of a semiconductor element formation region of the n-type semiconductor substrate 1, which region is sited apart from the p-type well region 2. The p$^+$-type semiconductor layers 3 correspond to the source and drain regions of a p-channel transistor. A gate electrode 6 is deposited on the n-type semiconductor substrate 1 through a gate insulating film 10. After an insulating film 8 is deposited to cover the entire surface, it is etched to form contact holes for the source and the drain. Metal wiring layers 7 are then deposited on the source and the drain regions to form the source and drain electrodes, respectively. Thus, a CMOSIC is prepared.

A width a as shown in FIG. 1 must be determined to render the effect of an n-channel parasitic transistor negligible. Similarly, a width b as shown in FIG. 1 must be determined to render the effect of a p-channel parasitic transistor negligible. Otherwise, a current flowing through the parasitic transistor continues to flow in the n-type semiconductor substrate 1 or the p-type well region 2, thus resulting in a voltage drop. The voltage drop may cause a start trigger for the latch-up phenomenon. Therefore, a minimum width between the p$^+$-type semiconductor layer 3 formed in the n-type semiconductor substrate 1 and the adjacent n$^+$-type semiconductor layer 4 formed in the p-type well region 2, that is, (a+b) should be about 10 μm. However, such a wide field insulating film or isolation region prevents the CMOSIC from being miniaturized and results in a major obstacle in semiconductor design and manufacture.

SUMMARY OF THE INVENTION

It is, therefore, an object of the present invention to provide a CMOS integrated circuit device which eliminates the conventional drawbacks and which has a high packing density.

In order to achieve the above object of the present invention, there is provided a CMOS integrated circuit device including: first and second regions of a semiconductor substrate of a first conductivity type, the first and second regions being surrounded and isolated by a field insulating film formed in and on a major surface of the semiconductor substrate; a first MOS transistor which is formed in the first region and which has a source and a drain of a second conductivity type; a third region of the second conductivity type which is formed in the second region and which has a low resistance; an epitaxial layer of the second conductivity type which is grown on the third region and which has a high resistance; and a second MOS transistor which is formed in the epitaxial layer and which has a source and a drain of the first conductivity type.

According to the present invention, the third region of the second conductivity type having a high impurity concentration is formed so as to underlay the epitaxial layer of the second conductivity type and of a low impurity concentration. Therefore, the width of the field insulating film can be reduced to about half of that of the conventional field insulating film, thus improving the packing density of the semiconductor device. Moreover, the effects of the parasitic transistors can be obviated.

DETAILED DESCRIPTION OF THE PREFERRED EMBODIMENT

Figure 2A:
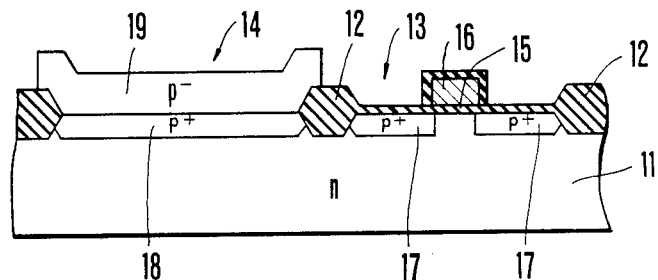
FIGS. 2A and 2B are sectional views for explaining the steps of manufacturing a CMOSIC according to an embodiment of the present invention.
Figure 2B:
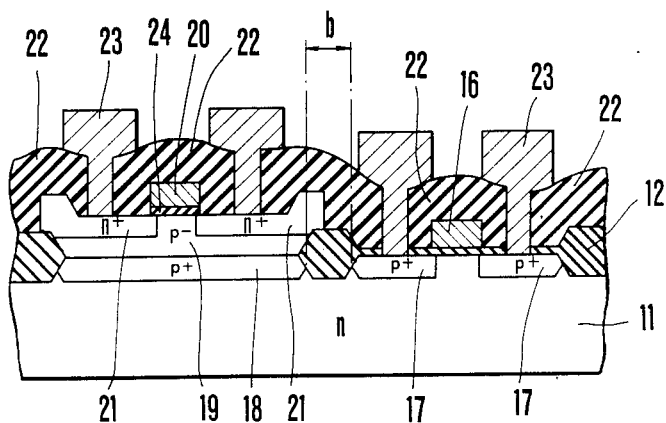

A CMOSIC according to an embodiment of the present invention will be described with reference to the accompanying drawings. FIGS. 2A and 2B are sectional views for explaining the steps of manufacturing the CMOSIC according to the embodiment.

Referring to FIG. 2A, a field insulating film 12 is formed on and in an n-type semiconductor substrate 11 so as to surround and form first and second regions 13 and 14 of the n-type semiconductor substrate. A gate insulating film 15 is then formed on the first region 13, and a gate electrode 16 of polycrystalline silicon is formed thereon. A p-type impurity is ion-implanted using as a mask the gate electrode 16 covered with an oxide film, so that p$^+$-type source and drain regions 17 are formed in a self-aligned manner. A p-channel MOS transistor is thus prepared. Simultaneously when ion implantation is performed as described above, a p$^+$-type region 18 as a third region is formed in the second region 14. A p$^-$-type epitaxial layer 19 of a high resistance is then grown on the p$^+$-type layer 18.

As shown in FIG. 2B, a gate insulating film 24 is formed on the p$^-$-type epitaxial layer 19, and a gate electrode 20 of polycrystalline silicon is deposited thereon. An n-type impurity is then ion-implanted using as a mask the gate electrode 20 covered with an oxide film, so that n+-type source and drain regions 21 are formed in a self-aligned manner. An n-channel MOS transistor is thus prepared. Thereafter, an insulating film 22 is formed to cover the entire surface. A mask pattern is then formed on the insulating film 22, which is then etched to form contact holes. The contact holes respectively correspond to the sources and drains of the n-channel and p-channel MOS transistors, respectively. Metal wiring layers 23 are then formed extending from the contact holes by selectively etching a deposited metal layer. Thus, a CMOSIC is prepared.

As shown in FIG. 2B, a width of the field insulating film can be as small as $b = ((a+b) - a)$ while still rendering the effect of the p-channel parasitic transistor negligible, and hence preventing the latch-up phenomenon. The width of the field insulating film can be reduced to half of that of the conventional device.

Figure 1:
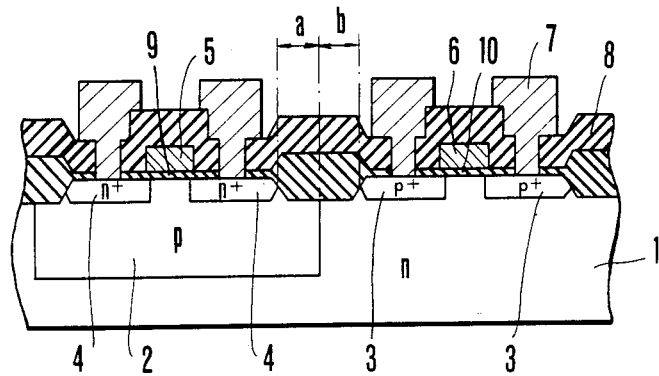
FIG. 1 is a sectional view showing an example of a conventional CMOSIC.

Since the p+-type region 18 is laid between the n-type semiconductor substrate 11 and the n+-type region 21 through the p--type epitaxial layer 19, the effect of the n-channel parasitic transistor can also be ignored. Furthermore, the upper surface of p+-type region 18 contacts the lower surface of the p--type epitaxial layer 19, so that a voltage drop caused by a current flowing therethrough is decreased as compared with a voltage drop in a conventional p-type well region 2 (FIG. 1). This further serves to prevent any latch-up phenomenon.

In the above embodiment, an n-type semiconductor substrate is used, but a p-type semiconductor substrate may alternatively be used. In this case, the conductivity types of all component regions are reversed. Such a reversal can be accomplished in a manner well known in the art, and there is no need of explaining the manner by referring to illustrations.

In summary, according to the present invention, a distance between the p-channel and n-channel MOS transistor regions of a CMOSIC can be reduced to half of that of the conventional CMOSIC. As a result, a highly integrated CMOSIC can be obtained according to the present invention.

What is claimed is:

1. A CMOS integrated circuit device comprising:
  a semiconductor substrate of a first conductivity type having a first and second region in closely adjacent relationship with each other;
  a field insulating film formed on said substrate to isolate and surround said first and second regions;
  a first MOS transistor constructed on said first region, said first MOS transistor including,
    a first drain layer and a first source layer, each being of a second conductivity type which is opposite to the first conductivity type, one of the first drain and the first source layers being disposed near said second region and another one being separated from said one of them by a part of said substrate,
    a first gate insulating film formed on said first drain and first source layers and said part of the substrate therebetween,
    a first gate layer formed on said first insulating film, and
    first metal wiring layers which are formed substantially perpendicular to the substrate and connected with said first drain and source layers, respectively, through corresponding first through holes formed in said first gate insulating film;
  a low resistance layer of the second conductivity type formed on the entire second region of said substrate;
  an expitaxial layer which is of the second conductivity type and has a high resistance formed on said low resistance layer to cover the entire second region surrounded by said field insulating film;
  a second MOS transistor constructed on said epitaxial layer, said second MOS transistor including,
    a second drain layer and a second source layer, each being of the first conductivity type, one of the second drain and second source layers being disposed near said first region, and another one being separated from said one of said second drain and source layers by a part of said epitaxial layer,
    a second gate insulating layer formed on said second drain and second source layers and said part of the epitaxial layer therebetween,
    a second gate layer formed on said second insulating film, and
    second metal wiring layers which are formed substantially perpendicular to the substrate and connected with said second drain and source layers, respectively, through corresponding second through holes formed in
    said second gate insulating film; and
  an insulating film formed on said first and second MOS transistors and said field insulating film to cover the entire surface of the device retaining said metal wiring layer projected from the surface of the device.

2. A circuit device according to claim 1, wherein said field insulating film has a width for seperation of said first and second regions of substantially not more than 5 μm.

3. A circuit device according to claim 1, wherein said third region has a high impurity concentration and is sandwiched between said semiconductor substrate of the first conductivity type and said epitaxial layer.

4. A circuit device according to claim 3, wherein said epitaxial layer of the second conductivity type has a low impurity concentration.

5. A circuit device according to claim 1, wherein the first conductivity type is an n-type and the second conductivity type is a p-type.

6. A circuit device according to claim 1, wherein the first conductivity type is a p-type and the second conductivity type is an n-type.

* * * * *